United States Patent
Kabe et al.

(10) Patent No.: US 8,318,267 B2
(45) Date of Patent: Nov. 27, 2012

(54) METHOD AND APPARATUS FOR FORMING SILICON OXIDE FILM

(75) Inventors: Yoshiro Kabe, Amagasaki (JP); Junichi Kitagawa, Amagasaki (JP); Sunao Muraoka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 890 days.

(21) Appl. No.: 12/301,770

(22) PCT Filed: May 22, 2007

(86) PCT No.: PCT/JP2007/060407
§ 371 (c)(1),
(2), (4) Date: Nov. 21, 2008

(87) PCT Pub. No.: WO2007/136049
PCT Pub. Date: Nov. 29, 2007

(65) Prior Publication Data
US 2010/0247805 A1    Sep. 30, 2010

(30) Foreign Application Priority Data
May 22, 2006   (JP) .................... 2006-141614

(51) Int. Cl.
*C23C 16/511*   (2006.01)

(52) U.S. Cl. ........................ 427/575; 427/579
(58) Field of Classification Search .............. 427/575, 427/579
See application file for complete search history.

(56) References Cited

U.S. PATENT DOCUMENTS

| 6,399,520 B1 | 6/2002 | Kawakami et al. |
| 6,470,824 B2 | 10/2002 | Kawakami et al. |
| 7,446,052 B2 * | 11/2008 | Sugawara et al. ............. 438/758 |

FOREIGN PATENT DOCUMENTS

| JP | 2000 294550 | 10/2000 |
| JP | 2001 85427 | 3/2001 |

OTHER PUBLICATIONS

NPL: English machine translation of JP2001-085427A, Mar. 2001.*
NPL-1: Samukawa et al, Control of nitrogen depth profile in ultrathin oxynitride films formed by pulse-time-modulated nitrogen beam, JVST A 22 (2), Mar./Apr. 2004, pp. 245-249.*

* cited by examiner

*Primary Examiner* — Jie Yang
(74) *Attorney, Agent, or Firm* —Oblon, Spivak, McClelland, Maier & Neustadt, L.L.P.

(57) ABSTRACT

An object to be processed which has silicon on its surface is loaded in a processing chamber. A plasma of a processing gas containing oxygen gas and nitrogen gas is generated in the processing chamber. The silicon on the surface of the object to be processed is oxidized by the plasma, thereby forming a silicon oxide film.

14 Claims, 7 Drawing Sheets

PLASMA OXIDATION PROCESS

METHOD AND APPARATUS FOR FORMING SILICON OXIDE FILM

FIELD OF THE INVENTION

The present invention relates to a method and an apparatus for forming a silicon oxide film on a surface of a target object, e.g., a silicon substrate having on its surface silicon by performing a plasma process thereon.

BACKGROUND OF THE INVENTION

Due to a recent trend toward high integration and miniaturization of semiconductor devices, it is required to form a thin film with high precision in a silicon oxide film forming process, e.g., a process for forming an oxide film such as a gate oxide film of a MOS semiconductor, an oxide film on a trench inner surface of a shallow trench isolation (STI) or the like. As for a conventional technique for forming such silicon oxide film, a thermal oxidation has been performed. In that case, however, it is difficult to form a thin film. Therefore, there is recently noticed a plasma oxidation process capable of forming a thin and high-quality oxide film with good controllability (e.g., International Publication No. WO 2004/073073).

Meanwhile, the plasma oxidation process described in International Publication No. WO 2004/073073 has a drawback in that its processing speed is slow in a recently desired low-temperature film formation performed at a temperature lower than or equal to about 600° C. Thus, there has been suggested a method of increasing a speed of forming a silicon oxide film by using a processing gas containing $H_2$ gas in addition to $O_2$ gas and a rare gas such as Ar gas or the like. Even when a silicon oxide film has oxygen deficiency, $H_2$ gas also serves to suppress dielectric breakdown by compensating the oxygen deficiency.

However, when hydrogen is introduced into the film, comparatively weak hydrogen bonds exist in the film. Such bonds are easily cut by current stress during use, so that dangling bonds are formed, thereby deteriorating characteristics of the silicon oxide.

SUMMARY OF THE INVENTION

In view of the above, the present invention provides a method and an apparatus for forming a high-quality silicon oxide film at a practical speed. Further, the present invention also provides a computer readable storage medium which stores therein a control program for executing the method for forming a silicon oxide film.

In accordance with a first aspect of the invention, there is provided a method for forming a silicon oxide film including: providing in a processing chamber a target object having silicon on its surface; forming in the processing chamber a plasma of a processing gas containing $O_2$ gas and $N_2$ gas; and forming a silicon oxide film by oxidizing the silicon on the surface of the target object by using the plasma.

In the first aspect, a nitrogen concentration in the silicon oxide film may be set to be smaller than or equal to about 1 weight %. Further, the processing gas may contain $O_2$ gas, a rare gas and $N_2$ gas. Moreover, the processing condition may be one where a processing pressure is higher than or equal to about 66.5 Pa and an $O_2$ gas concentration in the processing gas is greater than or equal to about 50 volume %, or where a processing pressure is higher than or equal to about 133 Pa, and an $O_2$ gas concentration in the processing gas is greater than or equal to about 10 volume %. In the latter, it is preferable that the processing pressure is higher than or equal to about 400 Pa or the $O_2$ gas concentration in the processing gas is greater than or equal to about 25 volume %.

In the first aspect, an $N_2$ gas concentration in the processing gas may be set to be in a range from about 1 volume % to about 50 volume %. Furthermore, the processing temperature may be set to about 250° C. to about 800° C.

The plasma is preferably formed by exciting the processing gas with microwaves. Particularly, the plasma is preferably formed by exciting the processing gas with the microwaves radiated from a planar antenna member having a plurality of slots.

Further, preferably, a processing pressure is higher than or equal to about 66.5 Pa and an $O_2$ gas concentration in the processing gas is greater than or equal to about 50 volume %, or the processing pressure is higher than about 133.5 Pa and the $O_2$ gas concentration in the processing gas is greater than or equal to about 10 volume %, and a $N_2$ gas concentration in the processing gas is about 10 volume % to about 50 volume %.

In accordance with a second aspect of the invention, there is provided a method for forming a silicon oxide film including: providing in a processing chamber a target object having silicon on its surface; introducing a processing gas containing a rare gas, $O_2$ gas and $N_2$ gas such that the $O_2$ gas has a concentration of about 25 volume % or higher and the $N_2$ gas has a concentration of about 1 to 50 volume %, while controlling a pressure in the processing chamber to about 400 Pa or higher; converting the processing gas into a plasma by radiating into the processing chamber microwaves through a planar antenna member having a plurality of slots; and forming a silicon oxide film by oxidizing the silicon on the surface of the target object by using the plasma.

In accordance with a third aspect of the invention, there is provided an apparatus for forming a silicon oxide film including: a processing chamber in which a target object having silicon on its surface is provided; a gas supply mechanism for supplying into the processing chamber a processing gas containing $O_2$ gas and $N_2$ gas; a heating mechanism for heating the target object in the processing chamber; a plasma generating mechanism for converting the processing gas into a plasma; and a control unit for controlling a processing pressure to about 66.5 Pa or higher and a concentration of the $O_2$ gas in the processing gas to about 50 volume % or higher, or controlling a processing pressure to about 133.5 Pa or higher, a concentration of the $O_2$ gas in the processing gas to about 10 volume % or higher and a concentration of the $N_2$ gas in the processing gas to about 1 to 50 volume %, wherein a silicon oxide film is formed by oxidizing the silicon on the surface of the target object by using the processing gas converted into the plasma by the plasma generating mechanism.

In the third aspect, the heating mechanism may heat the target object at about 250 to 800° C. Further, the plasma generating mechanism may excite the processing gas by using microwaves. Specifically, the plasma generating mechanism may excite the processing gas by using the microwaves radiated from a planner antenna member having a plurality of slots.

In accordance with a fourth aspect of the invention, there is provided a computer readable storage medium storing therein a computer-executable program for controlling a plasma processing apparatus, wherein when the program is executed, the plasma processing apparatus is controlled by a computer to perform a method for forming a silicon oxide film, the method including: providing in a processing chamber a target object having silicon on its surface; introducing into the processing chamber a processing gas containing $O_2$ gas and $N_2$ gas while controlling a processing pressure in the processing chamber to about 66.5 Pa or higher and an $O_2$ concentration in the processing gas to about 50 volume % or higher, or controlling a processing pressure in the processing chamber to about 133.5 Pa or higher, an $O_2$ concentration in the processing gas to about volume % or higher, and an N concentration in the processing gas to about 1 to 50 volume %; converting the processing gas into a plasma; and forming a silicon oxide film by oxidizing the silicon on the surface of the target object by using the plasma.

In accordance with a fifth aspect of the invention, there is provided a computer readable storage medium storing therein a computer-executable program for controlling a plasma processing apparatus, wherein when the program is executed, the plasma processing apparatus is controlled by a computer to perform a method for forming a silicon oxide film, the method including: providing in a processing chamber a target object having silicon on its surface; introducing into the processing chamber a processing gas containing $O_2$ gas, a rare gas and $N_2$ gas while controlling an $O_2$ concentration in the processing gas to about 25 volume % or higher, an N concentration in the processing gas to about 1 to 50 volume % and a processing pressure in the processing chamber to about 400 Pa or higher; converting the processing gas into a plasma by radiating microwaves into the processing chamber via a planar antenna member having a plurality of slots; and forming a silicon oxide film by oxidizing the silicon on the surface of the target object by using the plasma.

In accordance with the present invention, a plasma is generated from a processing gas containing $O_2$ gas and $N_2$ gas, and typically from a processing gas containing $O_2$ gas, a rare gas such as Ar or the like, and $N_2$ gas and, then, a surface of a target object is oxidized by the plasma, thereby forming a high-quality silicon oxide film at a practical speed. That is, in the present invention, the oxidation by oxygen radicals in the plasma can be facilitated by using $N_2$ gas, so that the film formation speed can be increased without using hydrogen. Moreover, the use of $N_2$ gas enables nitrogen to be bonded to the dangling bonds of silicon and, thus, bonding force becomes strong compared to the case of using $H_2$ gas. Accordingly, a film quality can be improved. The reason that the use of $N_2$ gas improves an oxidation rate is explained by a following mechanism. When $O_2$ gas is excited, oxygen radicals and $O_2^+$ ions are formed. While the oxygen radicals contribute to the oxidation, the $O_2^+$ ions are extinguished on a wafer and thus do not contribute to the oxidation. However, the $O_2^+$ ions are accelerated by a plasma sheath near the wafer, and the silicon bonds on the wafer surface are cut by their kinetic energy. Hence, it is easy for the $O_2$ radicals to enter the film, thereby increasing the oxidation rate indirectly. If $N_2$ gas is added, $N_2$ gas is excited, and $N_2^+$ ions are mainly formed. In that case, the $N_2^+$ ions do not contribute to the nitriding. Further, as in the case of the $O_2^+$ ions, the $N_2^+$ ions are accelerated by the plasma sheath near the wafer, and the silicon bonds on the wafer surface are cut by their kinetic energy. Accordingly, it is easy for the $O_2$ radicals to enter the film, increasing the oxidation rate indirectly. In this way, the oxidation rate is increased by the addition of nitrogen. Meanwhile, the generation amount of the $N_2$ radicals contributing to the nitriding is small due to their high energy level, so that a small amount of N is introduced into the film. Especially, under the condition of high pressure and high oxygen concentration, energy density is low, and $N_2$ radicals are hardly generated. Therefore, the oxidation inhibition by the introduction of nitrogen into the film hardly occurs and, hence, a higher oxidation rate is obtained.

Even if $N_2$ gas is added to the processing gas, the amount of nitrogen in the film can be reduced to 1 weight %. Thus, a variation in a dielectric constant is small, and the characteristics of the silicon oxide film can be maintained.

Moreover, an oxidation process mainly using oxygen radicals can be performed under the condition of low electron temperature and high plasma density by using a plasma formed by exciting a processing gas with microwaves, especially a plasma formed by exciting a processing gas with microwaves radiated from a planar antenna member having a plurality of slots. As a result, it is possible to form a high-quality silicon oxide film with good controllability.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
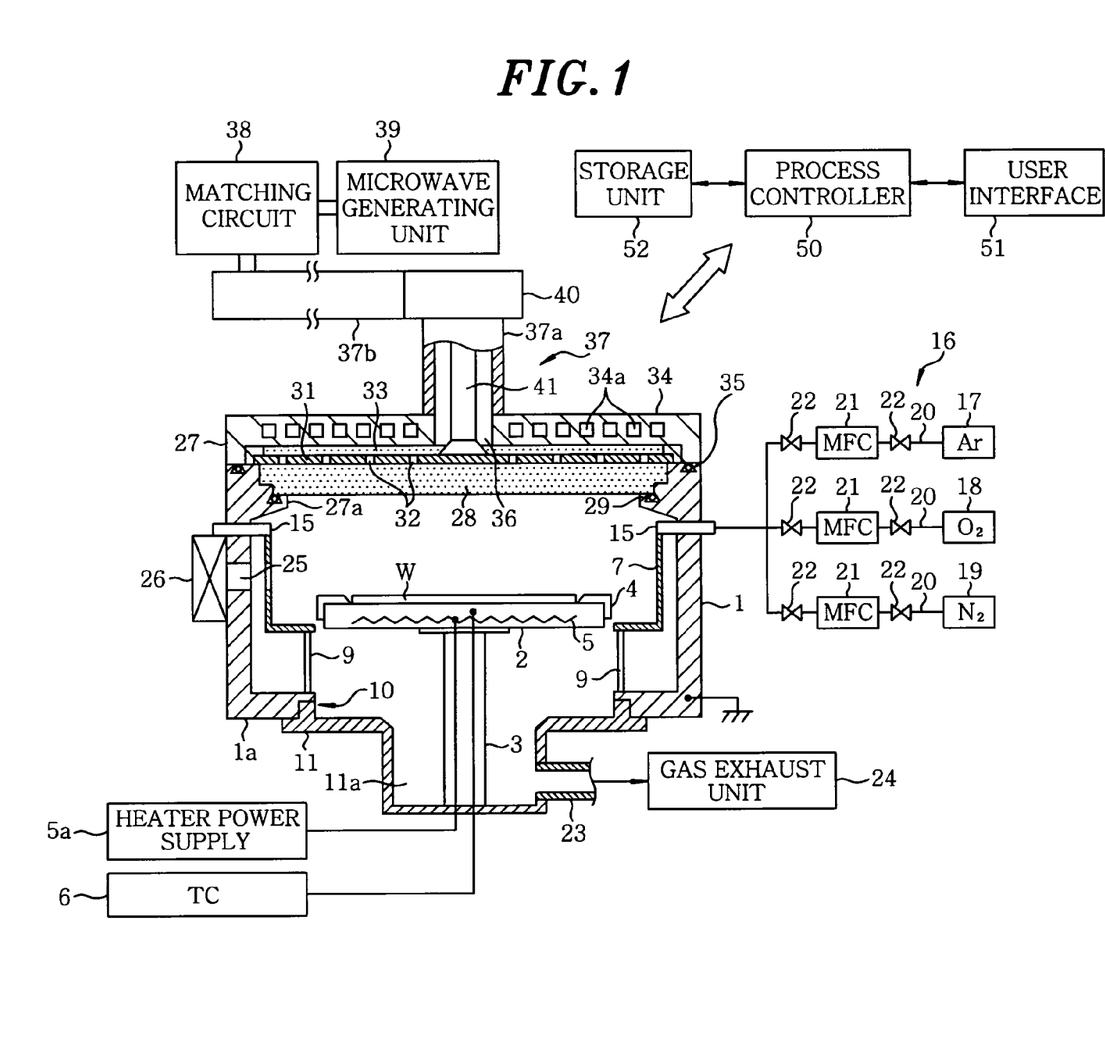
FIG. 1 is a schematic cross sectional view of an example of a plasma processing apparatus applicable to a method for forming a silicon oxide film of the present invention.

An embodiment of the present invention will be described with reference to the accompanying drawings which form a part hereof. FIG. 1 shows a schematic cross sectional view of an example of a plasma processing apparatus applicable to a method for forming a silicon oxide film of the present invention. The plasma processing apparatus 10 is configured as an RLSA (radial line slot antenna) microwave plasma processing apparatus capable of generating a microwave plasma of a high density and a low electron temperature by introducing microwaves into a processing chamber by using a planar antenna having a plurality of slots, particularly an RLSA. This apparatus can perform a low-damage process on a substrate by use of plasma having a plasma density of $1 \times 10^{10}$/cm$^3$ to $5 \times 10^{12}$/cm$^3$ and a low electron temperature of about 0.5 eV to about 2 eV.

The plasma processing apparatus 100 includes a substantially cylindrical airtight chamber 1 that is grounded. A circular opening 10 is formed at a substantially central portion of a bottom surface 1a of the chamber 1, and a gas exhaust chamber 11 projecting downward is provided on the bottom surface 1a to communicate with the opening 10.

A mounting table 2 made of ceramic, e.g., AlN or the like, is provided in the chamber 1 to horizontally support a silicon wafer (hereinafter, referred to as "wafer") W as a target object. Further, the mounting table 2 is supported by a cylindrical supporting member 3 extending upward from a central bottom portion of the gas exhaust chamber 11, the supporting member 3 being made of ceramic, e.g., AlN or the like. A cover ring 4 for guiding the wafer W is provided on an outer edge portion of the mounting table 2. The cover ring 4 is made of, e.g., quartz, AlN, $Al_2O_3$, SiN or the like.

A resistance heater 5 is buried in the mounting table 2 to heat the mounting table 2 by being supplied with power from a heater power supply 5a. The wafer W as a substrate to be processed is heated by heat thus generated. Moreover, a thermocouple 6a is arranged in the mounting table 2, so that a heating temperature of the wafer W can be controlled between the room temperature and about 900° C. The mounting table 2 is provided with wafer supporting pins (not shown) for supporting and moving the wafer W up and down. The wafer supporting pins can be protruded from and retracted into the top surface of the mounting table 2.

A cylindrical liner 7 made of quartz is provided on an inner periphery of the chamber 1 in order to prevent metal contamination caused by constituent materials of the chamber. In addition, an annular baffle plate 8 having a plurality of through holes is provided at the peripheral side of the susceptor 2 to uniformly exhaust the inside of the chamber 1. The baffle plate 8 is supported by a plurality of support columns 9.

An annular gas introducing member 15 is provided on a sidewall of the chamber 1, and a gas supply system 16 is connected thereto. The gas introducing member 15 may be disposed in a form of a nozzle shape or a shower shape. The gas supply system 16 includes, e.g., an Ar gas supply source 17, an $O_2$ gas supply source 18 and an $N_2$ gas supply source 19, and these gases are supplied to the gas introducing member 15 through respective gas lines 20, and then are introduced from the gas introducing member 15 into the chamber 1. Each of the gas lines 20 is provided with a mass flow controller 21 and opening/closing valves 22 disposed at upstream and downstream sides of the mass flow controller 21. Instead of the Ar gas, a rare gas such as Kr, Xe, He or the like can be used.

A gas exhaust line 23 is connected to a side surface of the gas exhaust chamber 11, and a gas exhaust unit 24 including a high speed vacuum pump is connected with the gas exhaust line 23. By operating the gas exhaust unit 24, a gas in the chamber 1 is uniformly discharged into a space 11a of the gas exhaust chamber 11 via the baffle plate 8 and then is exhausted through the gas exhaust line 23. Accordingly, the inside of the chamber 1 can be depressurized to a predetermined vacuum level at a high speed.

Provided on the sidewall of the chamber 1 are a loading/unloading port 25 for transferring the wafer W between the chamber 10 and a transfer chamber (not shown) adjacent to the plasma processing apparatus 100 and a gate valve 26 for opening and closing the loading/unloading port 25.

An upper portion of the chamber 1 has an opening, and an annular upper plate 27 is coupled to the opening. A lower portion of an inner periphery of the upper plate 27 is projected toward an inner space of the chamber to form an annular support portion 27a. A microwave transmitting plate 28 made of a dielectric material, e.g., quartz or ceramic such as $Al_2O_3$, AlN, or the like, is airtightly disposed on the support portion 27a via a sealing member 29. Therefore, the inside of the chamber 1 is airtightly maintained.

A circular plate-shaped antenna member 31 is provided on the microwave transmitting plate 28 while facing the susceptor 2. The antenna member 31 may be formed as, e.g., a square plate-shaped antenna member, without being limited to a circular plate-shaped antenna member, and is fixed to a top portion of the sidewall of the chamber 1. The antenna member 31 is made of, e.g., an aluminum plate or a copper plate coated with gold or silver, and has a plurality of slot-shaped microwave radiation holes 32 formed therethrough in a predetermined pattern.

Figure 2:
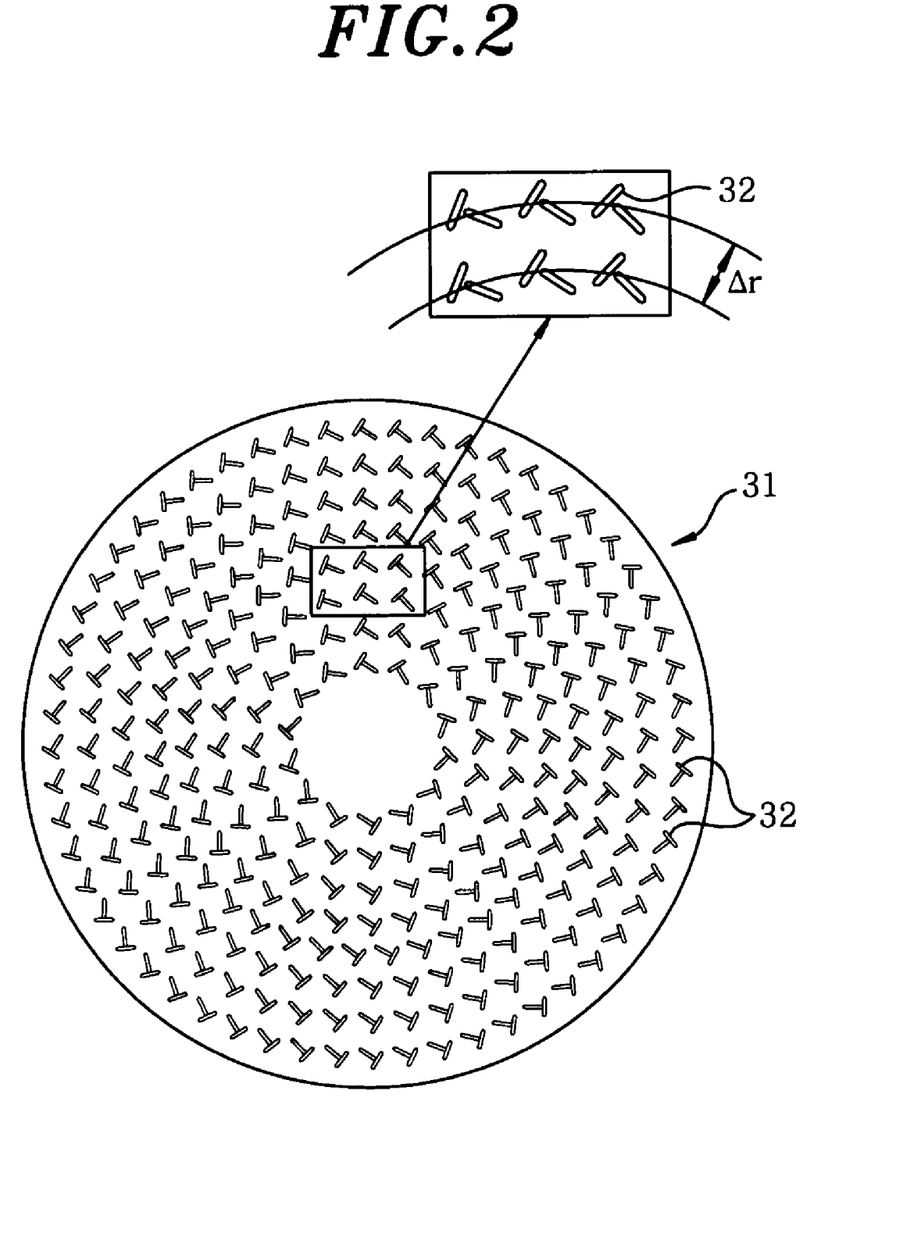
FIG. 2 shows a structure of a planar antenna member.

For example, the microwave radiation holes 32 have an elongated shape, as shown in FIG. 2, and typically, the adjacent microwave radiation holes 32 are disposed in a T shape. The plurality of microwave radiation holes 32 is concentrically disposed. A length of the microwave radiation hole 32 or an arrangement interval therebetween is determined depending on a wavelength λg of the microwave. For example, the microwave radiation holes 32 are spaced apart from each other at the interval of λg/4, λg/2 or λg. Further, in FIG. 3, the interval between the adjacent microwave radiation holes 32 that are concentrically disposed is indicated as Δr. Further, the microwave radiation holes 32 may have another shape, e.g., a circular shape, an arc shape or the like. Further, the microwave irradiation holes 32 can be arranged in another pattern, e.g., a spiral pattern, a radial pattern or the like, without being limited to the concentric circular pattern.

Provided on a top surface of the antenna member 31 is a retardation member 33 having a dielectric constant greater than that of a vacuum. Since the wavelength of the microwave becomes longer in the vacuum, the retardation member 33 has a function of controlling a plasma by shortening the wavelength of the microwave. Although the antenna member 31 may be in contact with or separated from the microwave transmitting plate 28 and the retardation member 33, it is preferable that they are in contact with each other.

A shield lid 34 made of a metal material, e.g., aluminum, stainless steel or the like, is provided on a top surface of the chamber 1 to cover the antenna member 31 and the retardation member 33. The top surface of the chamber 1 and the shield lid 34 are sealed by sealing members 35. Cooling water paths 34a are formed in the shield lid 34, so that the shield lid 34, the retardation member 33, the antenna member 31 and the microwave transmitting plate 28 can be cooled by circulating cooling water through the wafer paths 34a. Further, the shield lid 34 is grounded.

The shield lid 34 has an opening 36 at a center of a top wall thereof, and a waveguide 37 is connected with the opening. A microwave generating unit 39 for generating microwaves is connected with an end portion of the waveguide via a matching circuit 38. Accordingly, microwaves having a frequency of, e.g., 2.45 GHz, which are generated from the microwave generating unit 39, are propagated to the antenna member 31 via the waveguide 37. The microwaves may have a frequency of 8.35 GHz, 1.98 GHz or the like.

The waveguide 37 includes a coaxial waveguide 37a having a circular cross section and extending upward from the opening 36 of the shield lid 34, and a rectangular waveguide 37b extending horizontally and connected with an upper portion of the coaxial waveguide 37a via a mode transducer 40. The mode transducer 40 between the rectangular waveguide 37b and the coaxial waveguide 37a has a function of converting a TE mode of the microwaves propagating in the rectangular waveguide 37b into a TEM mode. An internal conductor 41 is extended in the coaxial waveguide 37a, and a lower portion of the internal conductor 41 is fixedly connected to a center of the antenna member 31. As a consequence, the microwaves are efficiently and uniformly propagated to the antenna member 31 via the internal conductor 41 of the coaxial waveguide 37a radially.

Each component of the plasma processing apparatus 100 is connected with a process controller 50 having a micro processor (computer). The process controller 50 is connected with a user interface 51 having a keyboard, a display and the like. A process operator uses the keyboard when inputting commands for managing the plasma processing apparatus 100, and the display is used to display the operation status of the plasma processing apparatus 100.

Further, the process controller 50 is connected with a storage unit 52 for storing therein control programs for implementing various processes in the plasma processing apparatus 100 under the control of the process controller 50, recipes including processing condition data and the like, and information required for the control.

If necessary, the process controller 50 executes a recipe read from the storage unit 52 in response to instructions from the user interface 51, thereby implementing a required process in the plasma processing apparatus 100 under the control of the process controller 50. Further, the control programs or the recipes such as the processing condition data and the like can be stored in a computer-readable storage medium, e.g., a CD-ROM, a hard disk, a flexible disk, a flash memory or the like, or transmitted on-line from another device via, e.g., a dedicated line when necessary.

The plasma processing apparatus 100 configured as described above can perform a damage free plasma process on an underlying film or the like at a low temperature lower than or equal to about 800° C. and also can realize a uniform processing with a plasma of high uniformity.

Hereinafter, a method for forming a silicon oxide film by using the plasma oxidation apparatus 100 configured as described above will be described.

First of all, the wafer W as a target object having on its surface silicon to be oxidized is loaded through the loading/unloading port 25 into the chamber 1 by opening the gate valve 26 and then mounted on the mounting table 2.

Next, Ar gas, $O_2$ gas and $N_2$ gas are respectively introduced at specific flow rates from the Ar gas supply source 17, the $O_2$ gas supply source 18 and the $N_2$ gas supply source 18 into the chamber 1 through the gas introducing member 15. Further, a pressure in the processing chamber 1 is maintained at a predetermined processing pressure.

In order to obtain a high-quality silicon oxide film, it is preferable that the processing pressure in the chamber is high, and also that the processing gas has high concentration of oxygen. Further, the effect of increasing the oxide film forming rate by the addition of $N_2$ gas is affected by the processing pressure and the $O_2$ gas concentration. From the above, it is preferable that the processing pressure is higher than or equal to about 66.5 Pa, and the $O_2$ gas concentration in the processing gas is greater than or equal to about 50 volume %. Or, it is preferable that the processing pressure is higher than about 133 Pa, and the $O_2$ gas concentration in the processing gas is greater than or equal to about 10 volume %. In the latter case, it is more preferable that the processing pressure is higher than or equal to about 400 Pa, and the $O_2$ gas concentration in the processing gas is greater than or equal to about 25 volume %. Although the maximum $O_2$ gas concentration is not particularly limited, the actual maximum concentration is about 99 volume % by considering a relationship with other gases. Moreover, the maximum processing pressure is that at which the plasma can be generated, and it is actually about 1333 Pa.

In addition, although the $N_2$ gas concentration in the processing gas is not particularly limited, it is preferably about 1 volume % to about 50 volume %. When the $N_2$ gas concentration is smaller than about 1 volume %, the effects of increasing an oxide film forming speed and improving a film quality by the addition of $N_2$ gas may not be sufficiently obtained. Meanwhile, when it is greater than about 50 volume %, the above effects are not obtained and may adversely affect the oxidation process. The $N_2$ gas concentration is more preferably about 1 volume % to about 10 volume %.

Preferably, the gas flow rates of Ar gas, $O_2$ gas and $N_2$ gas are in the range of about 0 to 5000 mL/min (sccm)), about 10 to 1000 mL/min and about 10 to 1000 mL/min, respectively.

Besides, the processing temperature is preferably about 250° C. to about 800° C., and is more preferably about 250° C. to about 600° C. When it is higher than about 800° C., the oxidation reaction by the thermal energy increases, whereas the effect of increasing an oxidation rate by the addition of $N_2$ gas decreases.

Next, the microwaves from the microwave generating device 39 are transmitted to the waveguide 37 via the matching unit 38. The microwaves are supplied to the planar antenna member 31 via the rectangular waveguide 37b, the mode transducer 40 and the coaxial waveguide 37a sequentially, and are then emitted to a space above the wafer W in the chamber 1 through the microwave transmitting plate 28 of the planar antenna member 31. The microwaves propagate in the rectangular waveguide 37b in the TE mode. The TE mode of the microwaves is converted into the TEM mode in the mode transducer 40, and the microwave propagates in the TEM mode through the coaxial waveguide 37a toward the antenna member 31. At this time, the power of the microwave generating device 39 is preferably in a range from about 0.5 to 5 kW.

An electromagnetic field is formed in the chamber 1 by the microwaves radiated from the antenna member 31 into the chamber 1 via the microwave transmitting plate 28, thereby converting Ar gas, $O_2$ gas and $N_2$ gas into plasma. Then, the silicon on the surface of the wafer W is oxidized by the plasma. By radiating the microwaves through the plurality of microwave radiation holes 32 of the antenna member 31, the plasma having a high density ranging from about $1 \times 10^{10}$ to $5 \times 10^{12}/cm^3$ and an electron temperature of about 0.5 to 2 eV is generated. At this time, the uniformity of the plasma density is about ±5% or less. Accordingly, the oxidation process using oxygen radicals can be performed at a low temperature and in a short period of time. Further, a high-quality silicon oxide film can be formed with good controllability because the substrate and the formed film are less damaged by ions. Especially, in a region where the processing pressure and the $O_2$ gas concentration are high, since the oxygen radicals increase, the oxidation process causing less damages can be performed and, hence, a higher film quality can be achieved. Moreover, it is considered that $N_2$ gas serves to help the oxidation process using oxygen radicals, so that the rate of forming a silicon oxide film can be increased by the addition of $N_2$ gas. That is, when $O_2$ gas is excited, oxygen radicals and $O_2^+$ ions are formed. While the oxygen radicals contribute to the oxidation, the $O_2^+$ ions are extinguished on a wafer and thus do not contribute to the oxidation. However, the $O_2^+$ ions are accelerated by a plasma sheath near the wafer, and the silicon bonds on the wafer surface are cut by their kinetic energy. Hence, it is easy for the $O_2$ radicals to enter the film, thereby increasing the oxidation rate indirectly. If $N_2$ gas is added, $N_2$ gas is excited, and $N_2^+$ ions are mainly formed. In that case, the $N_2^+$ ions do not contribute to the nitriding. Further, as in the case of the $O_2^+$ ions, the $N_2^+$ ions are accelerated by the plasma sheath near the wafer, and the silicon bonds on the wafer surface are cut by their kinetic energy. Accordingly, it is easy for the $O_2$ radicals to enter the film, increasing the oxidation rate indirectly. In this way, the oxidation rate is increased by the addition of nitrogen. Meanwhile, the generation amount of the N₂ radicals contributing to the nitriding is small due to a high energy level, so that a small amount of N is introduced into the film. Especially, under the condition of high pressure and high oxygen concentration, energy density is low, and N₂ radicals are hardly generated. Therefore, the oxidation inhibition by the introduction of nitrogen into the film hardly occurs and, hence, a higher oxidation rate is obtained. To be specific, the above effects from the addition of N₂ gas increase especially when the processing pressure is higher than or equal to about 66.5 Pa and the O₂ gas concentration in the processing gas is greater than or equal to about 50 volume %, or when the processing pressure is higher than about 133 Pa and the O₂ gas concentration in the processing gas is greater than or equal to about 10 volume %. Further, the addition of N₂ gas enables nitrogen to be bonded to the dangling bonds of silicon and, thus, a stronger bond can be obtained compared to the case of adding H₂ gas. As a result, it is possible to obtain a higher quality silicon oxide film.

Figure 3A:
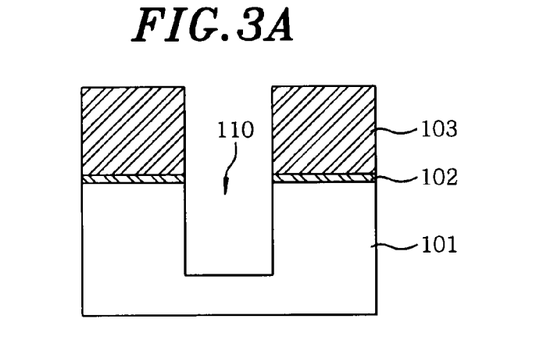
FIGS. 3A to 3C are schematic cross sectional views of a process for forming a silicon oxide film on a trench inner surface of an STI.

Hereinafter, an application example of the method for forming a silicon oxide film of the present invention will be explained. Here, an example applied to an oxidation process inside a trench formed by etching a silicon wafer in forming an STI structure will be described with reference to the schematic views of FIGS. 3A to 3C. Referring to FIG. 3A, a silicon oxide film 102 is formed by thermal oxidation on a silicon substrate 101 and, then, a silicon nitride film 103 is formed thereon. Next, the silicon nitride film 103 and the silicon oxide film 102 are patterned by a conventional photolithographic process. Thereafter, a trench etching is performed on the silicon substrate 101 while using the silicon nitride film 103 as a mask, thereby forming an opening of the trench 110.

Figure 3B:
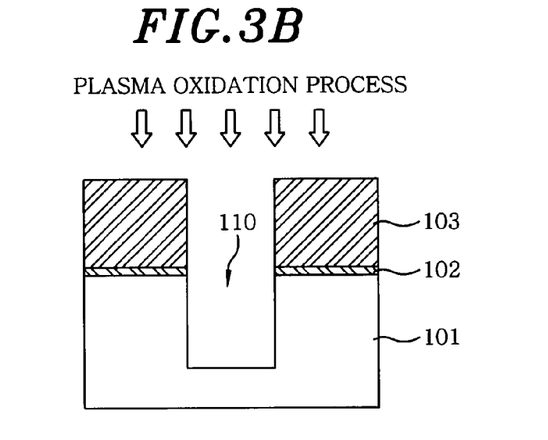

From that state, the plasma oxidation process of the present embodiment is performed on the trench 110 formed after the STI etching, as illustrated in FIG. 3B. As a consequence, a silicon oxide film 111 having a good film quality can be formed on an inner surface of the trench 110 at a practical speed, as can be seen from FIG. 3C.

Figure 4:
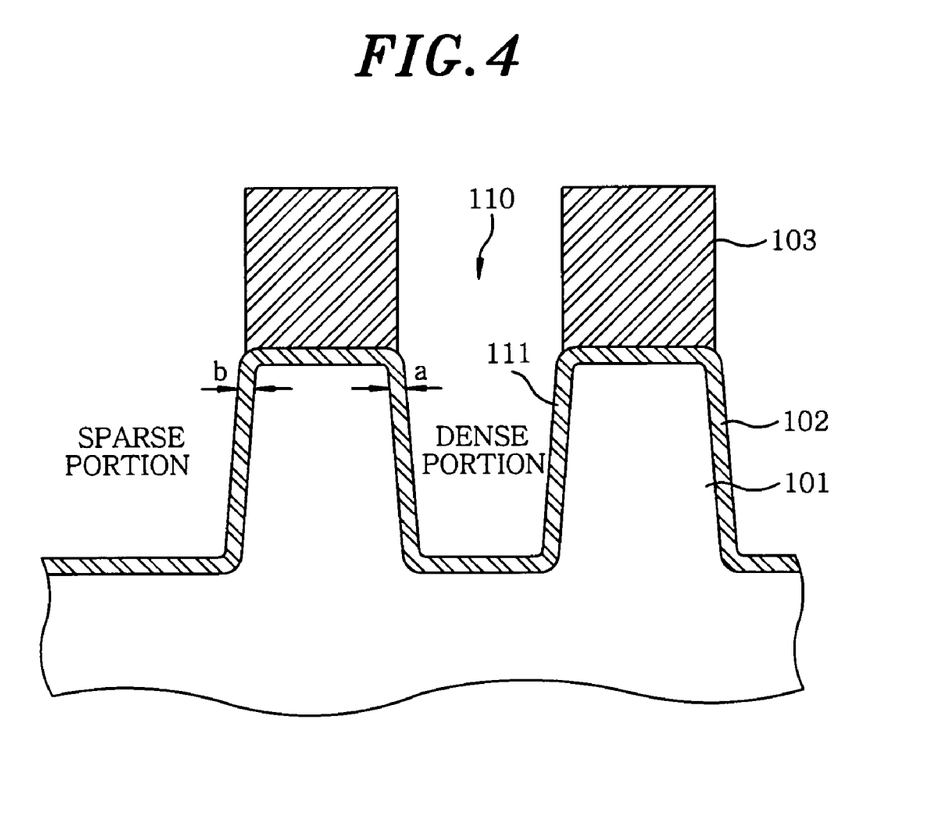
FIG. 4 depicts a cross sectional view specifically showing an actual pattern obtained by forming the silicon oxide film on the inner surface of the trench of the STI.

FIG. 4 specifically describes an actual pattern obtained by forming the silicon oxide film 111 on the inner surface of the trench 110 of the silicon substrate 101. Here, there are formed a dense pattern portion (dense portion) and a sparse pattern portion (sparse portion). In accordance with the conditions of the present embodiment, it is possible to form the silicon oxide film 111 having a good film quality at a practical speed, and also possible to obtain a uniform film thickness in an upper and a lower portion of the silicon oxide film 111. Besides, an oxide film thickness in the dense portion (indicated by "a") and that in the sparse portion (indicated by "b") can be uniformly obtained.

Figure 3C:
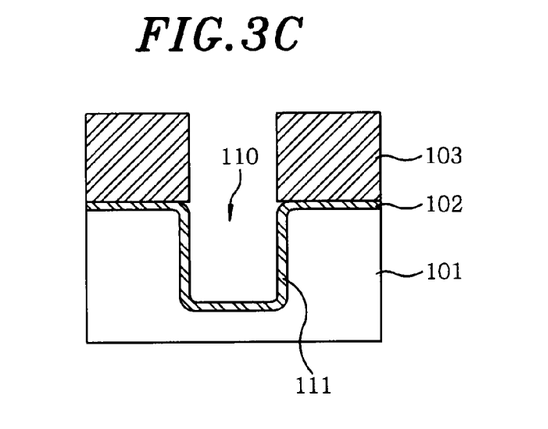

After the silicon oxide film 111 is formed, according to a sequence of an STI method, an insulating film such as SiO₂ or the like is buried in the trench 110 by, e.g., a CVD method. Next, a CMP process is performed for planarization by using the silicon nitride film 103 as a stopper film. Thereafter, the silicon nitride film 103 and an upper portion of the buried insulating film are removed by etching, thus forming a device isolation structure.

Hereinafter, the test results showing the effects of the present invention will be explained.

An oxidation process was performed on a bare wafer by using the plasma processing apparatus 100 shown in FIG. 1. First of all, a silicon oxide film was formed at about 600° C. for about 180 seconds by using a processing gas containing gas and Ar gas while varying a processing pressure between about 6.65 and 933 Pa and the O₂ gas concentration between about 1 and 100 volume %. At this time, N₂ gas was not added, and a microwave power was controlled to about 3.8 kW. Next, a film thickness was measured by using an optical film thickness meter. The O₂ gas concentration was calculated from the flow rates of the respective gases. When the O₂ gas concentration was smaller than or equal to about 50 volume %, a total flow rate of O₂ gas and N₂ gas was controlled to about 1000 mL/min. When the O₂ gas concentration was about 75 volume % and about 100 volume %, the flow rate of O₂ gas was controlled to about 500 mL/min (1000 mL/min×0.5=500 mL/min) as same as when the O₂ gas concentration was about 50 volume %. The flow rate of Ar gas in the respective cases was about 133 mL/min and 0 mL/min. The result will be shown in following Table 1. As can be seen from Table 1, it was generally found that a film thickness becomes thinner, i.e., a film forming rate becomes lower, under the conditions of high pressure and high O₂ gas concentration which provide a high film quality.

TABLE 1 numerical value: film thickness (nm)

| | | Processing pressure (Pa) | | | | | |
|---|---|---|---|---|---|---|---|
| | | 6.65 | 66.5 | 133 | 400 | 665 | 933 |
| O₂ gas concentration (volume %) | 1 | 5.04 | 4.55 | 4.26 | 4.35 | 3.73 | 2.82 |
| | 10 | 6.54 | 4.50 | 3.45 | 2.22 | 2.34 | 2.57 |
| | 25 | 7.06 | 3.71 | 2.68 | 2.16 | 2.38 | 2.79 |
| | 50 | 8.02 | 3.80 | 2.52 | 2.36 | 2.83 | 3.19 |
| | 75 | 6.11 | 3.41 | 2.35 | 2.59 | 3.10 | 3.45 |
| | 100 | 5.82 | 3.49 | 2.45 | 2.88 | 3.25 | 3.65 |

Figure 5:
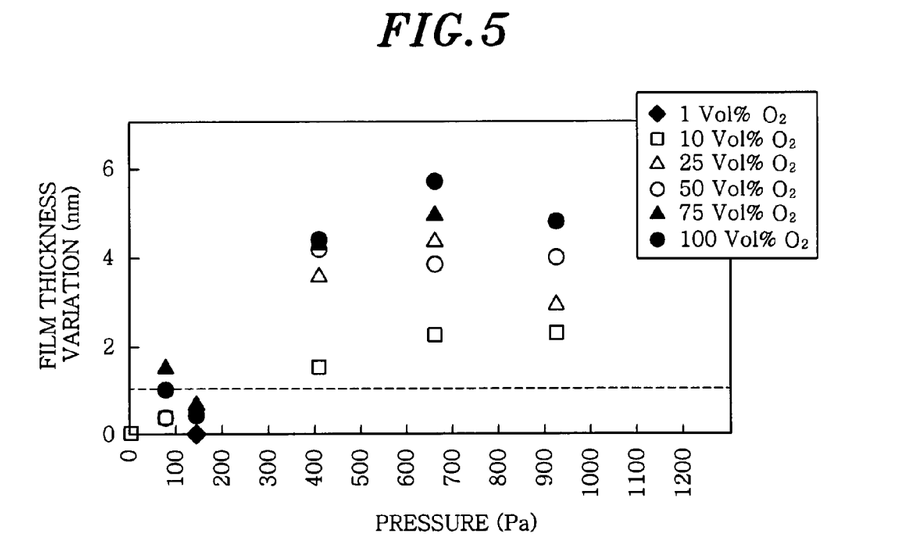
FIG. 5 illustrates a relationship between a pressure and a film thickness variation.
Figure 6:
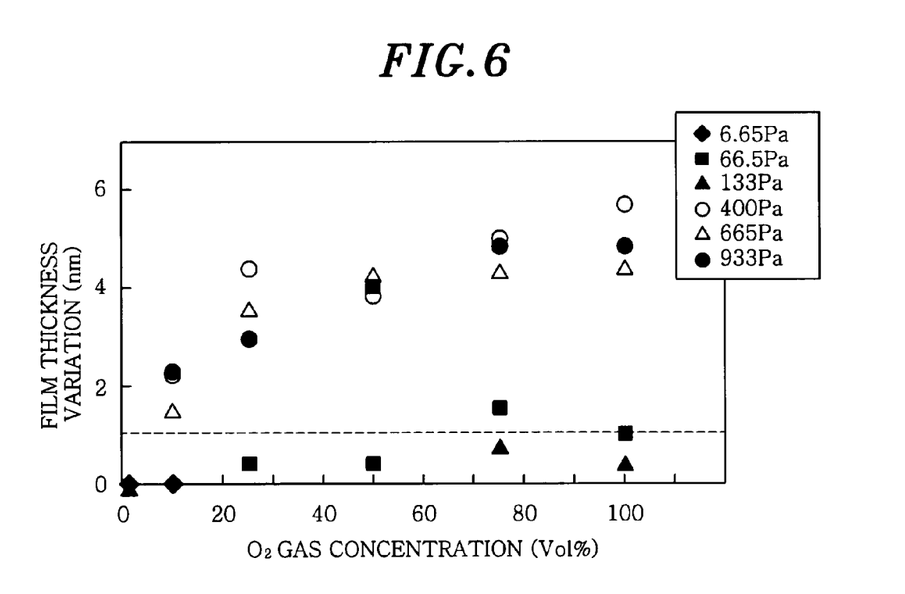
FIG. 6 describes a relationship between an $O_2$ gas concentration and a film thickness variation.

In the same manner, a silicon oxide film was formed at about 600° C. for about 180 seconds while varying a processing pressure between about 6.65 Pa and about 933 Pa and the O₂ gas concentration between about 1 volume % and about 100 volume %. At this time, N₂ gas was added at 5 volume %, and a microwave power was controlled to about 3.8 kW. Next, a film thickness was measured by using an optical film thickness meter. In this case, a ratio of N₂/O₂ was about 0.05 to 5. When the O₂ gas concentration was smaller than or equal to about 50 volume %, a total flow rate of O₂ gas, Ar gas and N₂ gas was controlled to about 1000 mL/min. At this time, a flow rate of N₂ gas was fixed to about 50 mL/min, and the flow rates of O₂ gas and Ar gas were controlled so that the O₂ gas concentration was controlled to a predetermined value. When the O₂ gas concentration was about 75%, the flow rate of O₂ gas was controlled to about 500 mL/min as same as when the O₂ gas concentration was about 50 volume %, and Ar gas and N₂ gas were added at the respective flow rates of about 133 mL/min and about 33 mL/min. Although the O₂ gas concentration of about 100 volume % is indicated as 100% in Table 1, the flow rate of O₂ gas was actually controlled to about 500 mL/min, and the flow rate of N₂ gas was controlled to about 25 mL/min. A film thickness variation at that time will be shown in following Table 2. Numerical values in Table 2 indicate a film thickness variation by an addition of N₂ gas at about 5 volume %, and minus means a decrease. FIGS. 5 and 6 represent a relationship between a pressure and a film thickness variation and that between an O₂ gas concentration and a film thickness variation, respectively. It was found from Table 2 and FIGS. 5 and 6 that an increasing rate of a film thickness increased under the conditions of high pressure and high O₂ gas concentration at which a film forming rate is low. To be specific, it was found that the effects of increasing a film thickness, i.e., the effects of increasing a film forming rate, were obtained when the processing pressure was higher than or equal to about 66.5 Pa and the $O_2$ gas concentration in the processing gas was greater than or equal to about 50 volume %, or when the processing pressure was higher than about 133 Pa, preferably 400 Pa or higher, and the $O_2$ gas concentration in the processing gas was greater than or equal to about 10 volume %. It was also found that the effects of increasing a film forming rate increased especially when the processing pressure was higher than or equal to about 400 Pa and the $O_2$ gas concentration was greater than or equal to about 50 volume %.

TABLE 2 numerical value: film thickness variation (%) in accordance with addition of $N_2$ gas at 5 volume %

| | | Processing pressure (Pa) | | | | | |
|---|---|---|---|---|---|---|---|
| | | 6.65 | 66.5 | 133 | 400 | 665 | 933 |
| $O_2$ gas concentration (volume %) | 1 | — | −28.2 | — | −37.9 | −37.4 | −22.3 |
| | 10 | — | −4.6 | −6.6 | 15.6 | 22.8 | 23.4 |
| | 25 | −9.0 | 4.6 | −3.1 | 36.2 | 44.4 | 30.1 |
| | 50 | −4.9 | 4.5 | 4.7 | 42.6 | 38.6 | 40.5 |
| | 75 | −6.7 | 16.0 | 8.0 | 43.4 | 50.4 | 48.6 |
| | 100 | −7.5 | 10.3 | 4.6 | 44.3 | 57.0 | 48.3 |

* addition of $N_2$ gas of 25 mL/min to $O_2$ gas of 500 mL/min

Figure 7:
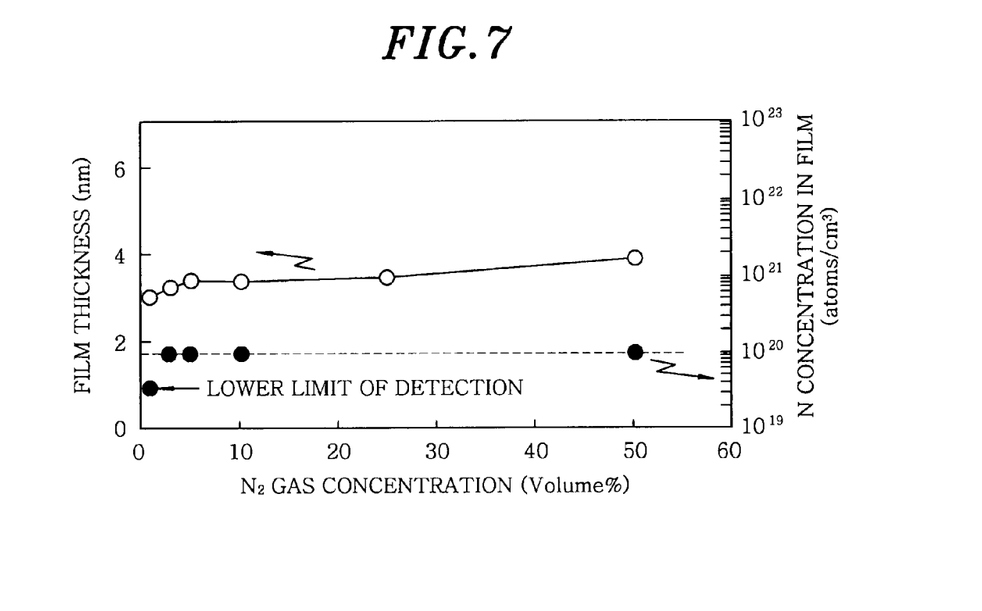
FIG. 7 depicts a relationship between an $N_2$ gas concentration and a film thickness variation.

Next, a silicon oxide film was formed under the conditions as follows: an $O_2$ gas concentration of about 25 volume %; a processing pressure at about 665 Pa; a microwave power of about 3.8 kW; and a processing time of about 180 seconds. Meanwhile, an addition amount of $N_2$ gas and a temperature were varied. The following Table 3 shows a film thickness variation in case of not adding $N_2$ gas. FIG. 7 illustrates a relationship between an $N_2$ gas concentration and an oxide film thickness at 600° C. As clearly can be seen from Table 3, a maximum film thickness variation was obtained when the $N_2$ gas concentration was about 5 volume % and, also, the film thickness variation increases again when the $N_2$ gas concentration was greater than or equal to about 10 volume %. Moreover, it has been found that the dependency of the film thickness variation on the $N_2$ gas concentration is hardly changed with respect to the temperature. Referring to FIG. 7, even when the $N_2$ gas concentration exceeded about 5 volume %, the oxide film thickness did not increase greatly. Further, as can be seen from FIG. 7, some effects were obtained when the $N_2$ gas concentration was about 1 to 50 volume %, but the effects were sufficient when it was about 1 to 10 volume %. Referring to FIG. 7 illustrating a relationship between the $N_2$ gas concentration and the N concentration in the film near the surface which was measured by an SIMS analysis, it was found that even if the $N_2$ gas concentration increased, the N concentration near the film surface was maintained at about $10^{20}$ atoms/cm$^3$.

TABLE 3 numerical value: film thickness variation (%) and temperature dependency in various $N_2$ gas concentrations

| | | $N_2$ gas concentration (volume %) | | | | | |
|---|---|---|---|---|---|---|---|
| | | 1 | 3 | 5 | 10 | 25 | 50 |
| Temperature (° C.) | 250 | 30.4 | 36.6 | 38.3 | 38.4 | 50.8 | 61.2 |
| | 400 | 26.9 | 35.8 | 38.2 | 37.3 | 47.6 | 60.0 |
| | 500 | 23.6 | 33.7 | 36.6 | 33.9 | 45.5 | 60.4 |
| | 600 | 25.8 | 36.0 | 40.3 | 39.9 | 42.5 | 56.7 |

Figure 8:
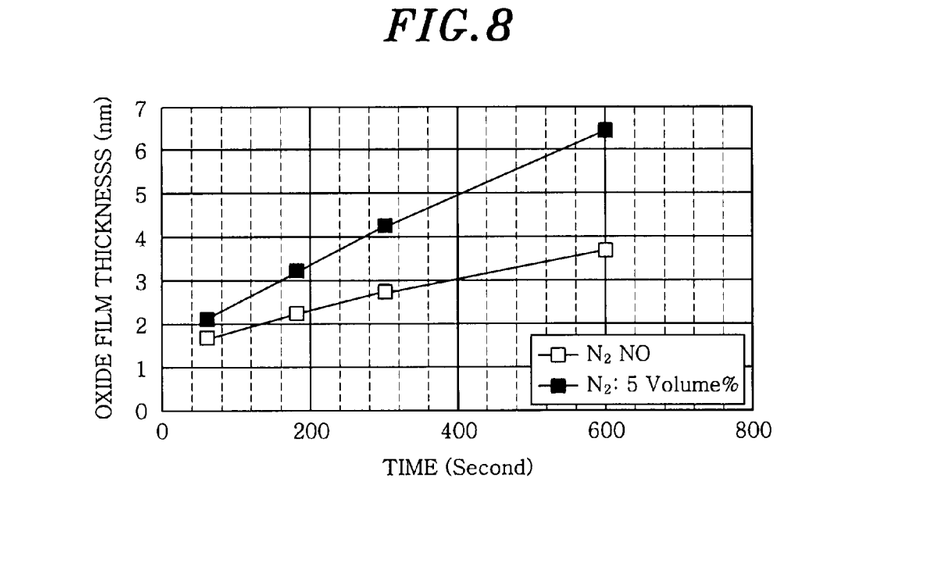
FIG. 8 provides a diagram for comparing a temporal change of an oxide film thickness in case of adding $N_2$ gas at 5 volume % with that in case of not adding $N_2$ gas.

Thereafter, an oxide film was formed under the conditions as follows: an $O_2$ gas concentration of about 25 volume %; a processing pressure at about 665 Pa; a microwave power of about 3.8 kW; and a temperature at about 600° C. Then, a temporal variation of an oxide film thickness was monitored in the case of adding $N_2$ gas at about 5 volume % and in the case of not adding $N_2$ gas. The results thereof are described in FIG. 8. It was found from FIG. 8 that the film forming rate increased by the addition of $N_2$ gas. Further, it was also found that a throughput increased twice to three times by the addition of $N_2$ gas in the same film thickness.

Figure 9:
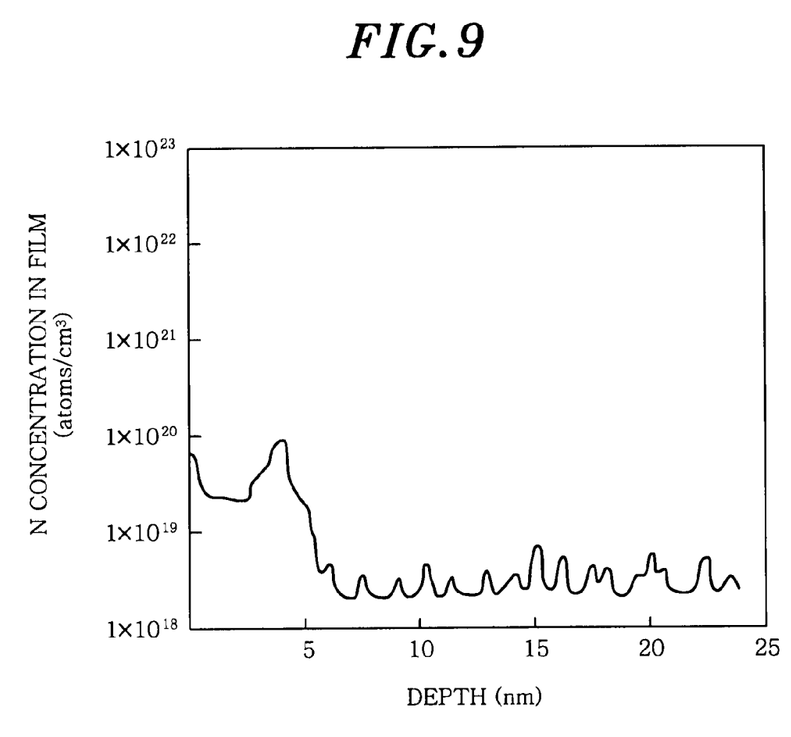
FIG. 9 shows an analysis result of nitrogen concentration in a silicon oxide film in the case of adding $N_2$ gas at 5 volume %.

Next, a silicon oxide film of 4 nm was formed by performing plasma processing in the case of adding $N_2$ gas at 5 volume % and in the case of not adding $N_2$ gas under the conditions as follows: an $O_2$ gas concentration of about 25 volume %; a processing pressure at about 665 Pa; a microwave power of about 3.8 kW; and a temperature at about 600° C. At this time, a processing time was varied. Thereafter, the silicon oxide film was immersed into dilute hydrofluoric acid. As a result, when $N_2$ gas was not added, an etched amount was about 1.72 nm. Meanwhile, when $N_2$ gas was added, an etched amount was about 1.79 nm. It was found that the etched amount obtained in the case of adding $N_2$ gas was similar to that obtained in the case of not adding $N_2$. Next, there was performed an SIMS analysis in the thickness direction of the silicon oxide film formed by adding $N_2$ gas at about 5 volume %. As a result, it was found that the N concentration was merely about $10^{20}$ atoms/cm$^3$ even in the surface having the highest N concentration, as shown in FIG. 9. When the above N concentration is converted into a weight density, it is smaller than or equal to about 0.1 weight %. It was found that the N concentration was smaller than about 1 weight despite that the addition of $N_2$ gas increased.

The present invention can be variously modified without being limited to the above embodiments. For example, in the above embodiments, the microwave plasma processing apparatus 100 for exciting plasma by using microwaves having a frequency of 300 MHz to 300 GHz is used. However, it is also possible to use a radio frequency plasma processing apparatus for exciting plasma by using a radio frequency power having a frequency of 30 kHz to 300 MHz. Further, although the RLSA plasma processing apparatus is used in the above embodiments, the present invention is not limited thereto and may also be applied to another plasma processing apparatus, e.g., a remote plasma processing apparatus, an inductively coupled plasma (ICP) plasma processing apparatus, an electron cyclotron resonance (ECR) plasma processing apparatus, a surface reflected wave plasma processing apparatus, a magnetron plasma processing apparatus or the like.

In the above embodiment, the formation of a silicon oxide film inside a trench of an STI has been described as an example. However, the present invention is not limited thereto and may also be applied to the formation of various silicon oxide films, e.g., formation of an oxide film on a side surface of an etched polysilicon gate electrode, formation of an oxide film on a planer surface, e.g., a gate oxide film or the like, having no irregularities.

What is claimed is:
1. A method for forming a silicon oxide film comprising:
providing in a processing chamber a target object having silicon on its surface;
forming in the processing chamber a plasma of a processing gas containing $O_2$ gas and $N_2$ gas; and
forming a silicon oxide film by oxidizing the silicon on the surface of the target object by using the plasma, wherein the highest nitrogen concentration in the silicon oxide film is smaller than or equal to about 1 weight %, and wherein a concentration of N in atoms/cm$^3$ is substantially constant from 0-5 nm depth of the silicon oxide film.

2. The method of claim 1, wherein the processing gas contains $O_2$ gas, a rare gas and $N_2$ gas.

3. The method of claim 1, wherein a processing pressure is higher than or equal to about 66.5 Pa, and an $O_2$ gas concentration in the processing gas is greater than or equal to about 50 volume %.

4. The method of claim 1, wherein a processing pressure is higher than about 133 Pa, and an $O_2$ gas concentration in the processing gas is greater than or equal to about 10 volume %.

5. The method of claim 4, wherein the processing pressure is higher than or equal to about 400 Pa.

6. The method of claim 4, wherein the $O_2$ gas concentration in the processing gas is greater than or equal to about 25 volume %.

7. The method of claim 1, wherein an $N_2$ gas concentration in the processing gas ranges from about 1 volume % to about 50 volume %.

8. The method of claim 1, wherein a processing temperature is about 250° C. to about 800° C.

9. The method of claim 1, wherein the plasma is formed by exciting the processing gas by using a microwave plasma method, an inductively coupled plasma (ICP) plasma method, a remote plasma method, an electron cyclotron resonance (ECR) plasma method, a surface reflected wave plasma method, or a magnetron plasma method.

10. The method of claim 9, wherein the plasma is formed by exciting the processing gas with the microwaves radiated from a planar antenna member having a plurality of slots.

11. The method of claim 1, wherein a processing pressure is higher than or equal to about 66.5 Pa and an $O_2$ gas concentration in the processing gas is greater than or equal to about 50 volume %, or the processing pressure is higher than about 133.5 Pa and the $O_2$ gas concentration in the processing gas is greater than or equal to about 10 volume %, and a $N_2$ gas concentration in the processing gas is about 10 volume % to about 50 volume %.

12. A method for forming a silicon oxide film comprising:
providing in a processing chamber a target object having silicon on its surface;
introducing a processing gas containing a rare gas, $O_2$ gas and $N_2$ gas such that the $O_2$ gas has a concentration of about 25 volume % or higher and the $N_2$ gas has a concentration of about 1 to 50 volume %, while controlling a pressure in the processing chamber to about 400 Pa or higher;
converting the processing gas into a plasma by radiating into the processing chamber microwaves through a planar antenna member having a plurality of slots; and
forming a silicon oxide film by oxidizing the silicon on the surface of the target object by using the plasma,
wherein the highest nitrogen concentration in the silicon oxide film is smaller than or equal to about 1 weight %, and
wherein a concentration of N in atoms/cm$^3$ is substantially constant from 0-5 nm depth of the silicon oxide film.

13. A method for forming a silicon oxide film comprising:
providing in a processing chamber a target object having silicon on its surface;
forming in the processing chamber a plasma of a processing gas containing $O_2$ gas and $N_2$ gas; and
forming a silicon oxide film by oxidizing the silicon on the surface of the target object by using the plasma,
wherein a processing pressure is higher than or equal to about 66.5 Pa, and an $O_2$ gas concentration in the processing gas is greater than or equal to about 50 volume %, the highest nitrogen concentration in the silicon oxide film is smaller than or equal to about 1 weight %, and
a concentration of N in atoms/cm$^3$ is substantially constant from 0-5 nm depth of the silicon oxide film.

14. A method for forming a silicon oxide film comprising:
providing in a processing chamber a target object having silicon on its surface;
forming in the processing chamber a plasma of a processing gas containing $O_2$ gas and $N_2$ gas; and
forming a silicon oxide film by oxidizing the silicon on the surface of the target object by using the plasma,
wherein a processing pressure is higher than about 133 Pa, and an $O_2$ gas concentration in the processing gas is greater than or equal to about 10 volume %,
the highest nitrogen concentration in the silicon oxide film is smaller than or equal to about 1 weight %, and
a concentration of N in atoms/cm$^3$ is substantially constant from 0-5 nm depth of the silicon oxide film.

* * * * *